(12) United States Patent
Lee et al.

(10) Patent No.: US 10,763,294 B2
(45) Date of Patent: Sep. 1, 2020

(54) IMAGE SENSOR CHIPS HAVING SUB-CHIPS

(71) Applicant: Samsung Electronics Co., Ltd., Suwon-si, Gyeonggi-do (KR)

(72) Inventors: Jaekyu Lee, Seongnam-si (KR); Sung In Kim, Hwaseong-si (KR); Byung-Joon Baek, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/203,912

(22) Filed: Nov. 29, 2018

(65) Prior Publication Data

US 2019/0267423 A1  Aug. 29, 2019

(30) Foreign Application Priority Data

Feb. 28, 2018  (KR) ........................ 10-2018-0024694

(51) Int. Cl.
| | | |
|---|---|---|
| *H01L 27/146* | (2006.01) | |
| *H04N 5/369* | (2011.01) | |
| *H04N 5/3745* | (2011.01) | |
| *H04N 5/378* | (2011.01) | |

(52) U.S. Cl.
CPC .. *H01L 27/14636* (2013.01); *H01L 27/14603* (2013.01); *H01L 27/14612* (2013.01); *H01L 27/14621* (2013.01); *H01L 27/14627* (2013.01); *H01L 27/14634* (2013.01); *H01L 27/14643* (2013.01); *H01L 27/14689* (2013.01); *H04N 5/378* (2013.01); *H04N 5/379* (2018.08); *H04N 5/37455* (2013.01)

(58) Field of Classification Search
CPC ......... H01L 27/14636; H01L 27/14634; H01L 27/14643; H01L 5/379; H01L 5/378; H01L 5/37455
See application file for complete search history.

(56) References Cited

U.S. PATENT DOCUMENTS

| | | |
|---|---|---|
| 7,289,145 B2 | 10/2007 | Johnson et al. |
| 7,795,958 B2 | 9/2010 | Agarwal et al. |
| 8,605,173 B2 | 12/2013 | Lee et al. |
| 8,773,552 B2 | 7/2014 | Egawa |
| 9,024,406 B2 * | 5/2015 | Churchwell ...... H01L 27/14609 257/443 |
| 9,607,971 B2 | 3/2017 | Asayama et al. |

(Continued)

FOREIGN PATENT DOCUMENTS

KR  10-2017-0096102  8/2017

*Primary Examiner* — Sitaramarao S Yechuri
(74) *Attorney, Agent, or Firm* — Sughrue Mion, PLLC

(57) ABSTRACT

An image sensor chip may include a first sub-chip, a second sub-chip on the first sub-chip, and an interconnector between the first and second sub-chips. The first sub-chip may include a first substrate, a bottom electrode on a first region of the first substrate, and a first capacitor on the bottom electrode. The first capacitor may include a plurality of first electrodes vertically extending from a top surface of the bottom electrode, a second electrode on the first electrodes, and a first dielectric layer between the second electrode and the first electrodes. The second sub-chip may include a pixel array configured to convert incident light into an electrical signal. The pixel array may be electrically connected through the interconnector to the first capacitor.

17 Claims, 13 Drawing Sheets

(56) References Cited

U.S. PATENT DOCUMENTS

| | | |
|---|---|---|
| 9,716,510 B2 | 7/2017 | Mikov |
| 9,749,569 B2 | 8/2017 | Mabuchi et al. |
| 10,090,342 B1* | 10/2018 | Gambino .......... H01L 27/14634 |
| 2004/0036643 A1* | 2/2004 | Bock ...................... H04N 5/335 |
| | | 341/155 |
| 2005/0112792 A1* | 5/2005 | Chevallier ............. H04N 5/335 |
| | | 438/60 |
| 2009/0180015 A1* | 7/2009 | Nakamura ......... H04N 5/35554 |
| | | 348/308 |
| 2010/0238310 A1* | 9/2010 | Shizukuishi ...... H01L 27/14643 |
| | | 348/220.1 |
| 2013/0099291 A1* | 4/2013 | Shimotsusa ....... H01L 27/14609 |
| | | 257/225 |
| 2015/0060968 A1* | 3/2015 | Sa ..................... H01L 27/14609 |
| | | 257/292 |
| 2017/0099422 A1 | 4/2017 | Goma et al. |
| 2017/0171482 A1 | 6/2017 | Wakabayashi |
| 2017/0187977 A1 | 6/2017 | Iwabuchi et al. |
| 2017/0137061 A1 | 11/2017 | Takahashi et al. |

* cited by examiner under 35 U.S.C. § 119 to Korean Patent Application No. 10-2018-0024694, filed Feb. 28, 2018 in the Korean Intellectual Property Office, the entire contents of which are hereby incorporated herein by reference.

IMAGE SENSOR CHIPS HAVING SUB-CHIPS

CROSS-REFERENCE TO RELATED APPLICATION

This U.S. nonprovisional application claims priority under 35 U.S.C. § 119 to Korean Patent Application No. 10-2018-0024694, filed Feb. 28, 2018 in the Korean Intellectual Property Office, the entire contents of which are hereby incorporated herein by reference.

FIELD

Some embodiments of the present inventive concepts relate to image sensor chips, and more particularly, to image sensor chips including a first sub-chip and a second sub-chip that are vertically stacked.

BACKGROUND

An image sensor may be a semiconductor device that is configured to convert optical images into electrical signals. Examples of image sensors may include charge coupled device (CCD) type and complementary metal oxide semiconductor (CMOS) type. The CMOS type image sensor is abbreviated to CIS (CMOS image sensor). The CIS has a plurality of two-dimensionally arranged pixels. Each of the pixels includes a photodiode. The photodiode serves to convert incident light into electrical signals.

SUMMARY

Some embodiments of the inventive concepts provide image sensor chips having enhanced integration.

According to some embodiments of the inventive concepts, an image sensor chip may include a first sub-chip, a second sub-chip on the first sub-chip, and an interconnector between the first and second sub-chips. The first sub-chip may include a first substrate, a bottom electrode on a first region of the first substrate, and a first capacitor on the bottom electrode. The first capacitor may include a plurality of first electrodes vertically extending from a top surface of the bottom electrode, a second electrode on the first electrodes, and a first dielectric layer between the second electrode and the first electrodes. The second sub-chip may include a pixel array configured to convert incident light into an electrical signal. The pixel array may be electrically connected through the interconnector to the first capacitor.

According to some embodiments of the inventive concepts, an image sensor chip may include a first sub-chip, a second sub-chip on the first sub-chip, and an interconnector between the first and second sub-chips. The first sub-chip may include a first substrate including a first region and a second region, and first and second capacitors provided respectively on the first and second regions. The second sub-chip may include a pixel array configured to convert incident light into an electrical signal. The first capacitor may be electrically connected to a memory transistor on the first region. The second capacitor may be electrically connected through the interconnector to the pixel array. Each of the first and second capacitors may include a plurality of first electrodes extending in a direction perpendicular to a top surface of the first substrate, a second electrode on the first electrodes, and a dielectric layer between the second electrode and the first electrodes.

According to some embodiments of the inventive concepts, an image sensor chip may include a first sub-chip having a memory cell zone and a signal processing zone, and a second sub-chip on the first sub-chip. The second sub-chip may include a pixel array configured to convert incident light into an electrical signal. The first sub-chip may include a first capacitor on the memory cell zone, and a second capacitor on the signal processing zone. Each of the first and second capacitors may include a plurality of vertically extending first electrodes. Top surfaces of the first electrodes of the first capacitor may be substantially coplanar with top surfaces of the first electrodes of the second capacitor.

DETAILED DESCRIPTION OF EMBODIMENTS

Figure 1:
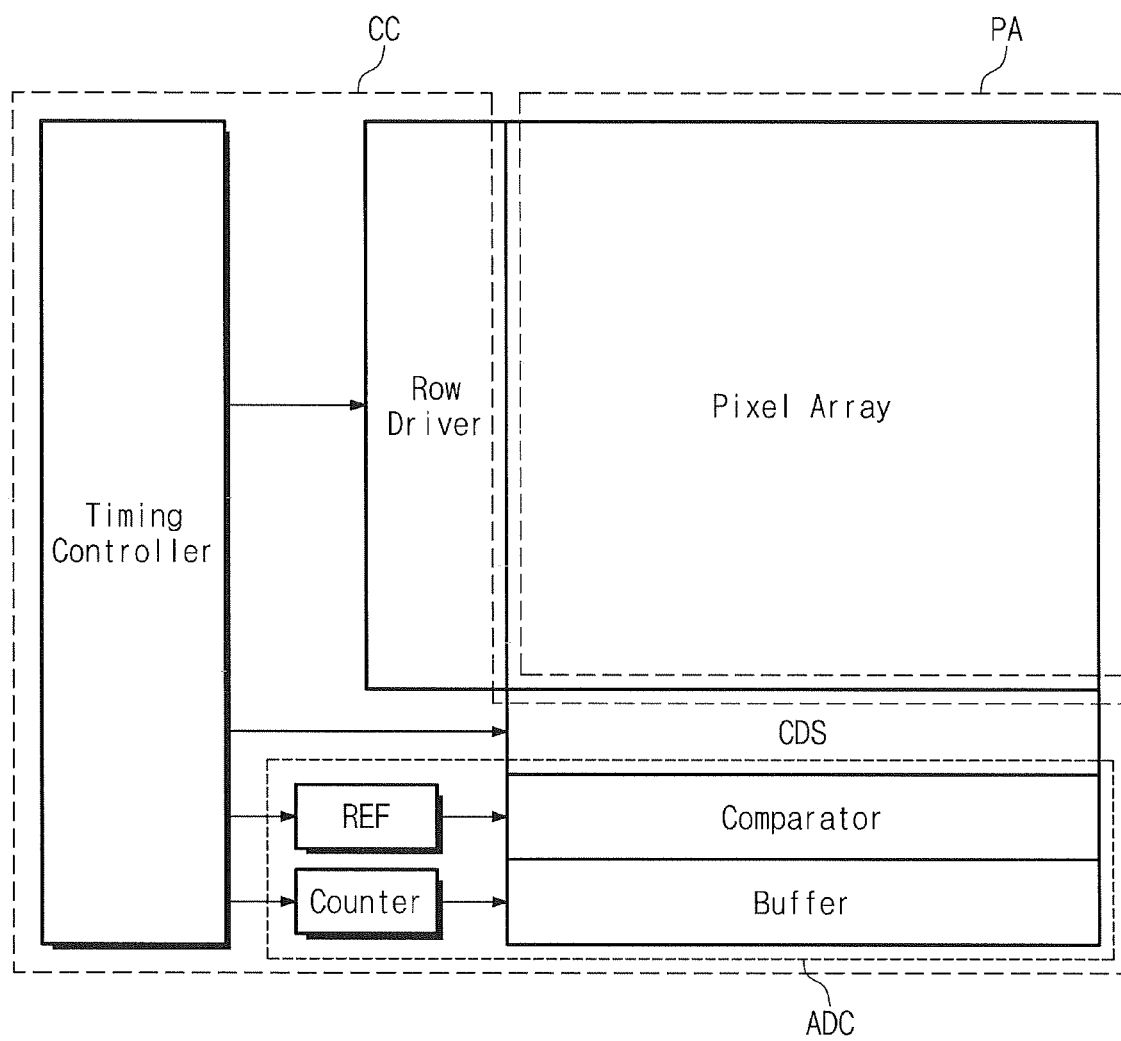
FIG. 1 is a schematic block diagram illustrating an image sensor according to some embodiments of the inventive concepts.

FIG. 1 is a schematic block diagram illustrating an image sensor according to some embodiments of the inventive concepts. For example, an image sensor of FIG. 1 may be a complementary metal oxide semiconductor (CMOS) image sensor.

Referring to FIG. 1, an image sensor may include a pixel array PA and a signal processor CC. The pixel array PA may convert incident light into electrical signals. The pixel array PA may include a plurality of unit pixels arranged in a matrix shape. The pixel array PA may be driven in response to various driving signals from the signal processor CC and may provide the converted electrical signals to the signal processor CC.

The signal processor CC may process the electrical signals to generate image data. The signal processor CC may include a row driver, a correlated double sampler (CDS), an analog-to-digital converter (ADC), and a timing controller.

The row driver may be connected to each row of the pixel array PA and may generate a row signal for driving each row. For example, the row driver may drive the unit pixels included in a given row of the pixel array PA.

The CDS may use a capacitor and/or a switch to obtain a difference between a reference voltage representing a reset state of the unit pixel and an output voltage representing a signal component corresponding to incident light, thereby performing a correlated double sampling and outputting an analog sampling signal corresponding to an effective signal component. The CDS may include a plurality of CDS circuits correspondingly connected to column lines of the pixel array PA, and may output an analog sampling signal corresponding to the effective signal component to each column.

The ADC may convert an analog image signal corresponding to the effective signal component into a digital image signal. The ADC may include a reference signal generator (REF), a comparator, a counter, and a buffer. The reference signal generator (REF) may generate, for example, a ramp signal with a specific slope and provide the ramp signal as a reference signal of the comparator. The comparator may compare the analog sampling signal that is output to each column from the CDS with the ramp signal that is generated from the reference signal generator (REF), thereby outputting comparison signals whose transition times are dependent on the effective signal components. The counter may perform a counting operation to generate a counting signal and may provide the buffer with the counting signal. The buffer may include a plurality of latch circuits connected to corresponding column lines, and may latch the counting signal output from the counter to each column in response to the transition of each comparison signal, thereby outputting the latched counting signal as image data.

The timing controller may control operation timings of the row driver, the CDS, and the ADC. The timing controller may provide tuning signals and control signals to the row driver, the CDS, and the ADC.

In some embodiments, the image sensor may perform the analog double sampling, but in other embodiments the image sensor may be configured to perform a digital double sampling (DDS). The digital double sampling may refer to a sampling method in which two analog signals of signal and reset components when a pixel is reset are converted into digital signals and a difference between the two analog signals is output as an effective signal component.

Figure 2:
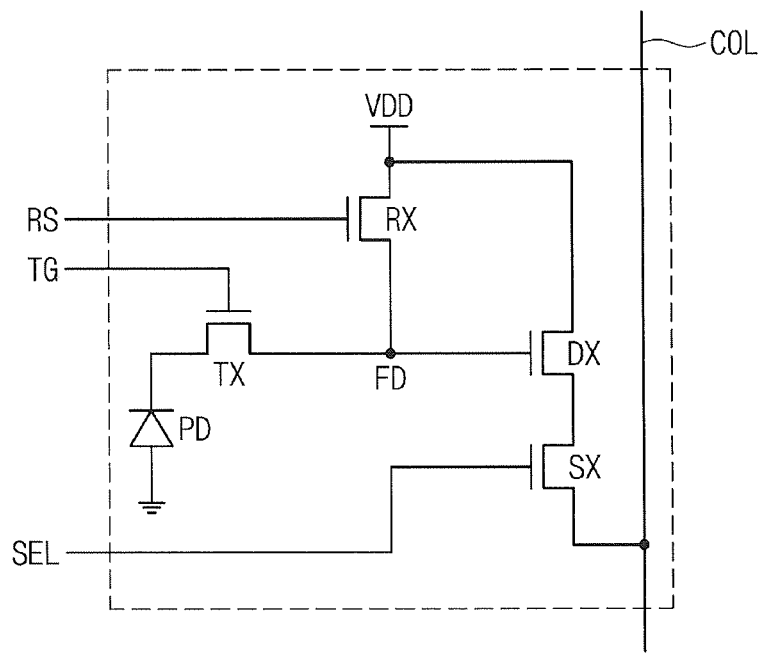
FIG. 2 is a circuit diagram illustrating an example of a unit pixel included in a pixel array according to some embodiments of the inventive concepts.

FIG. 2 is a circuit diagram illustrating an example of a unit pixel included in a pixel array according to some embodiments of the inventive concepts.

Referring to FIGS. 1 and 2, the unit pixel in the pixel array PA may include a photodiode PD as a photosensitive device. The unit pixel may include a transfer transistor TX, a reset transistor RX, a drive transistor DX, and a select transistor SX, all of which transistors may constitute a readout circuit.

The photodiode PD may receive external light (e.g., visible light or infrared light) to generate photo-charges based on the received light. Alternatively, the unit pixel may include a photo transistor, a photo gate, or a pinned photodiode, in addition to or instead of the photodiode PD.

The photo-charges generated in the photodiode PD may be transferred through the transfer transistor TX to a floating diffusion node FD. For example, when a transfer control signal TG has a first level (e.g., a high level), the transfer transistor TX may be turned on and the photo-charges generated in the photodiode PD may be transferred through the turned-on transfer transistor TX to the floating diffusion node FD.

The drive transistor DX may serve as a source follower buffer amplifier. The drive transistor DX may amplify a signal that corresponds to charges stored in the floating diffusion node FD. In response to a select signal SEL, the select transistor SX may transfer the amplified signal to a column line COL. The reset transistor RX may reset the floating diffusion node FD. For example, in response to a reset signal RS, the reset transistor RX may discharge the photo-charges stored in the floating diffusion node FD every period for the CDS operation.

Figure 3:
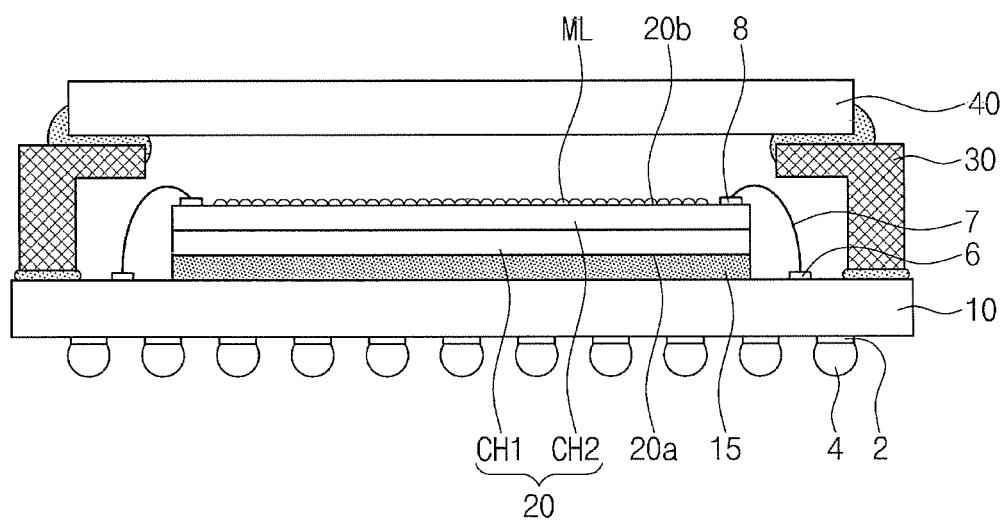
FIG. 3 is a cross-sectional view illustrating a semiconductor package mounted with an image sensor chip according to some embodiments of the inventive concepts.
Figure 4:
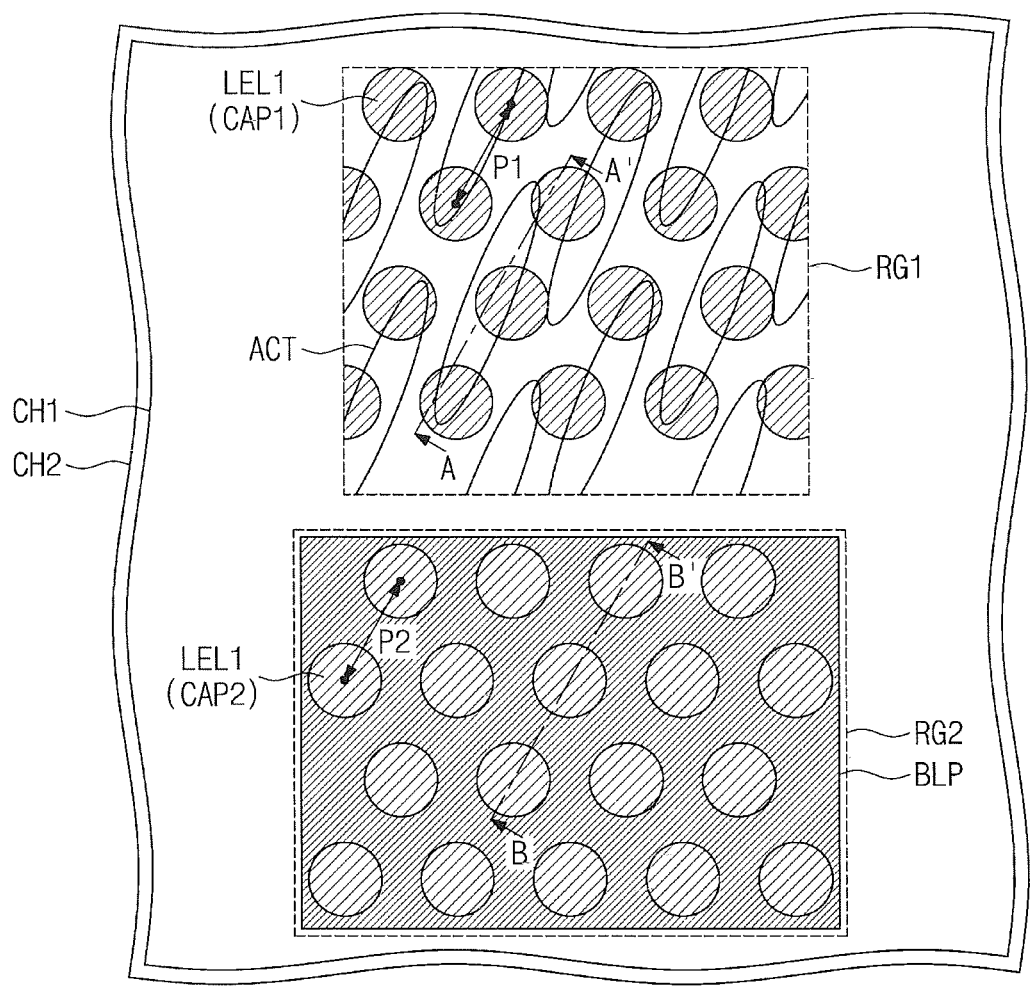
FIG. 4 is a plan view illustrating an image sensor chip according to some embodiments of the inventive concepts.
Figure 5:
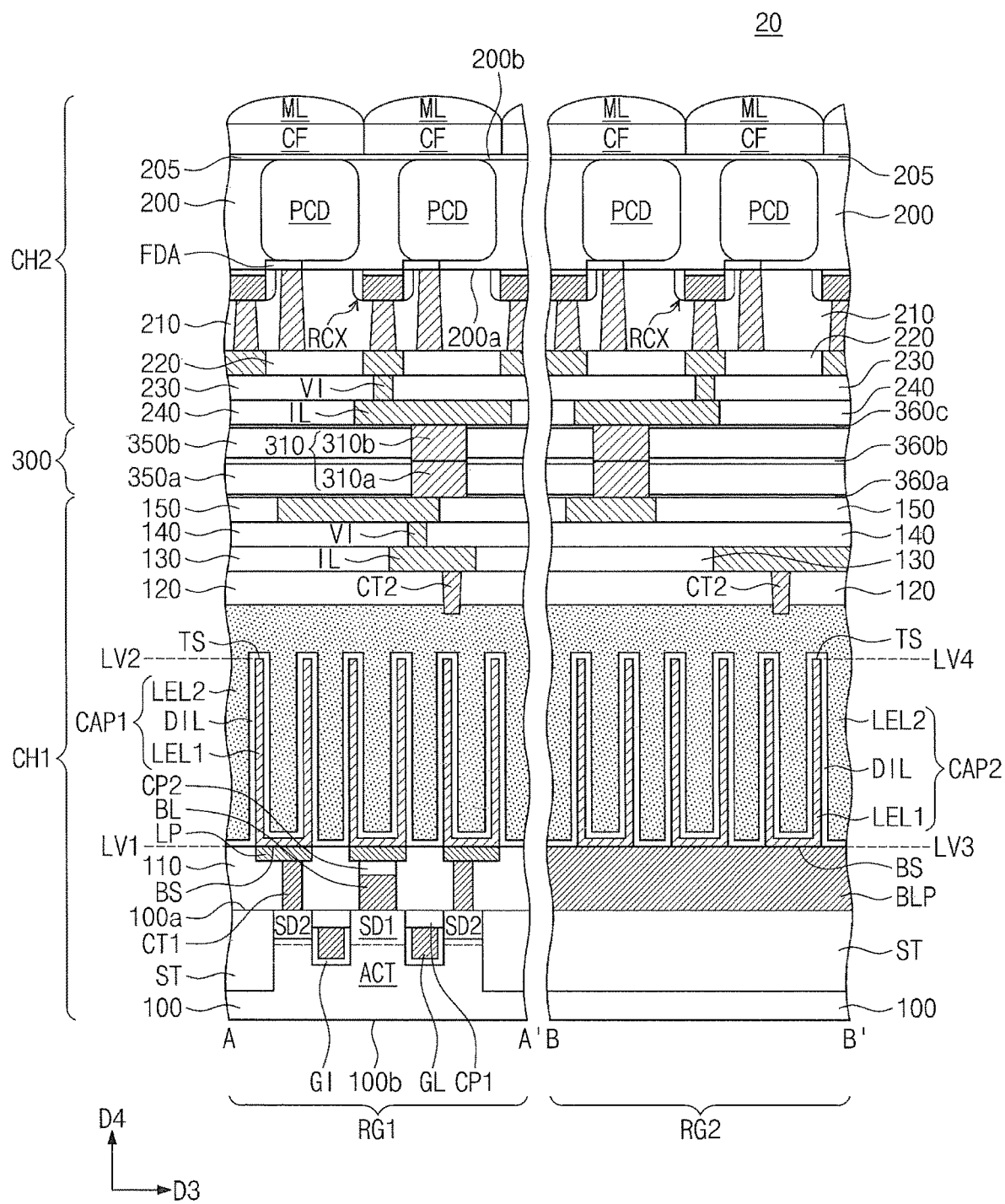
FIG. 5 is a cross-sectional view taken along lines A-A' and B-B' of FIG. 4 according to some embodiments of the inventive concepts.

FIG. 3 is a cross-sectional view illustrating a semiconductor package in which an image sensor chip is mounted, according to some embodiments of the inventive concepts. FIG. 4 is a plan view illustrating an image sensor chip according to some embodiments of the inventive concepts. FIG. 5 is a cross-sectional view taken along lines A-A' and B-B' of FIG. 4 according to some embodiments of the inventive concepts.

Referring to FIGS. 3, 4, and 5, an image sensor chip 20 may be mounted on a package substrate 10. A transparent substrate 40 may be provided on the image sensor chip 20. A holder 30 may be provided between the package substrate 10 and the transparent substrate 40. The holder 30 may support the transparent substrate 40. The holder 30 may force the transparent substrate 40 to lie vertically spaced apart from the image sensor chip 20.

The image sensor chip 20 may have a first surface 20a facing the package substrate 10 and a second surface 20b opposite to the first surface 20a. The image sensor chip 20 may include a first sub-chip CH1 and a second sub-chip CH2 that are vertically stacked. A plurality of micro-lenses ML may be on the second surface 20b of the image sensor chip 20.

The first sub-chip CH1 may include one or more of a logic zone, a memory cell zone, and a signal processing zone. For example, the first sub-chip CH1 may include the signal processor CC discussed above with reference to FIG. 1. The second sub-chip CH2 may be a pixel array chip. For example, the second sub-chip CH2 may include the pixel array PA discussed above with reference to FIG. 1.

Referring back to FIGS. 4 and 5, the image sensor chip 20 may include a first sub-chip CH1, a second sub-chip CH2, and an insert layer 300 between the first and second sub-chips CH1 and CH2. The first and second sub-chips CH1 and CH2 may be vertically stacked on each other. The insert layer 300 may physically and electrically connect the first and second sub-chips CH1 and CH2.

The first sub-chip CH1 may include a first region RG1 and a second region RG2 horizontally spaced apart from each other. The first region RG1 may be a memory cell zone provided with memory devices including memory transistors. For example, the first region RG1 may be a memory cell zone on which DRAM devices are disposed. The second region RG2 may be a capacitor zone provided with capacitors in the signal processor CC. For example, the second region RG2 may be a capacitor zone on which capacitors of the analog-to-digital converter (ADC) are disposed. The second region RG2 may include a capacitor of the correlated double sampler (CDS) circuit.

The first sub-chip CH1 may include a first substrate 100 and first and second capacitors CAP1 and CAP2 on the first substrate 100. The first and second capacitors CAP1 and CAP2 may be respectively provided on the first and second regions RG1 and RG2.

The first substrate 100 may have a first surface 100a and a second surface 100b opposite to the first surface 100a. The second surface 100b of the first substrate 100 may be the first surface 20a of the image sensor chip 20 discussed above with reference to FIG. 3. For example, in a semiconductor package, the second surface 100b of the first substrate 100 may face a package substrate.

The first region RG1 of the first substrate 100 of the first sub-chip CH1 may include a device isolation layer ST defining active regions ACT. For example, the device isolation layer ST may include a silicon oxide layer, a silicon nitride layer, or a silicon oxynitride layer. When viewed in a plan view, ones of the active regions ACT may have a bar shape whose major axis extends in a third direction D3.

The first substrate 100 may include gate lines GL extending across the active regions ACT. The gate lines GL may extend in a second direction D2 and may be arranged along a first direction D1. The gate lines GL may be embedded in the first substrate 100. The gate lines GL may include a conductive material. For example, the conductive material may be one or more of doped semiconductor (doped silicon, doped germanium, etc.), conductive metal nitride (titanium nitride, tantalum nitride, etc.), metal (tungsten, titanium, tantalum, etc.), and metal-semiconductor compound (tungsten silicide, cobalt silicide, titanium silicide, etc.).

A gate dielectric pattern GI may be interposed between the active region ACT and the gate lines GL. For example, the gate dielectric pattern GI may include a silicon oxide layer, a silicon nitride layer, or a silicon oxynitride layer.

A first capping pattern CP1 may be provided on top surfaces of the gate lines GL. The first capping pattern CP may have a top surface substantially coplanar with the first surface 100a of the first substrate 100. For example, the first capping pattern CP1 may include a silicon nitride layer or a silicon oxynitride layer.

Some of the active regions ACT may be provided therein with a first impurity region SD1 and a pair of second impurity regions SD2. The pair of second impurity regions SD2 may be spaced apart from each other across the first impurity region SD1.

The first impurity region SD1 may be provided in the active region ACT between a pair of neighboring gate lines GL. The second impurity regions SD2 may be in the active region ACT on opposite sides of the pair of neighboring gate lines GL. The second impurity regions SD2 may be spaced apart in the third direction D3 from each other across the pair of neighboring gate lines GL. The first impurity region SD1 may have substantially the same conductivity as that of the second impurity regions SD2.

A first lower insulation layer 110 may be on the first surface 100a of the first substrate 100 covering the active regions ACT. The first lower insulation layer 110 may include a silicon oxide layer or a silicon oxynitride layer.

Bit lines BL may be provided in the first lower insulation layer 110. The bit lines BL may extend in the first direction D1 and may be arranged along the second direction D2. The bit lines BL may be electrically connected to corresponding first impurity regions SD1. For example, the bit lines BL may include one or more of doped semiconductor, conductive metal nitride, metal, and metal-semiconductor compound. A second capping pattern CP2 may be provided on a top surfaces of the bit lines BL. For example, the second capping pattern CP2 may include a silicon nitride layer or a silicon oxynitride layer.

The first lower insulation layer 110 may include first contacts CT1 and landing pads LP. The landing pads LP may be on corresponding first contacts CT1. The first contacts CT1 may be electrically connected to corresponding second impurity regions SD2. The first contacts CT1 and the landing pads LP may include a conductive material such as doped silicon or metal.

A first capacitor CAP1 may be on the first lower insulation layer 110. The first capacitor CAP1 may include first electrodes LEL1, a second electrode LEL2, and a dielectric layer DIL between the second electrode LEL2 and the first electrodes LEL1. The first electrodes LEL1 may be on corresponding landing pads LP. Ones of the first electrodes LEL1 may be electrically connected to a respective one of the second impurity regions SD2 through a respective one of the landing pads LP and a respective one of the first contacts CT1. When viewed in a plan view, the first electrodes LEL1 may be arranged in a zigzag fashion along the first direction D1, as illustrated in FIG. 4. The first electrodes LEL1 may be linearly arranged along the third direction D3.

Ones of the first electrodes LEL1 may have a cylindrical or cup shape including a floor segment and a sidewall segment that vertically extends from the floor segment. The floor and sidewall segments of ones of the first electrodes LEL1 may have substantially the same thickness as each other. The first electrodes LEL1 may have substantially the same diameter as each other when viewed in a plan view.

The first electrodes LEL1 may include one or more of doped semiconductor, conductive metal nitride, metal, and metal-semiconductor compound. For example, the first electrodes LEL1 may include metal nitride layer such as a titanium nitride (TiN) layer, a titanium silicon nitride (TiSiN) layer, a titanium aluminum nitride (TiAlN) layer, a tantalum nitride (TaN) layer, tantalum silicon nitride (TaSiN) layer, tantalum aluminum nitride (TaAlN) layer, or a tungsten nitride (WN) layer.

The dielectric layer DIL may be provided to have a uniform thickness on surfaces of the first electrodes LEL1. For example, the dielectric layer DIL may include a high-k dielectric material such as $HfO_2$, $ZrO_2$, $Al_2O_3$, $La_2O_3$, $Ta_2O_3$, or $TiO_2$.

The second electrode LEL2 may be provided on the dielectric layer DIL. The second electrode LEL2 may cover a plurality of the first electrodes LEL1 with the dielectric layer DIL between the second electrode LEL2 and the plurality of the first electrodes LEL1. The second electrode LEL2 may have a portion filling a cylindrically shaped (or cup shaped) inside of the first electrode LEL1. The second electrode LEL2 may include one or more of doped semiconductor, conductive metal nitride, metal, and metal-semiconductor compound. For example, the second electrode LEL2 may have a structure where a metal nitride layer and a semiconductor layer are sequentially stacked.

Second to fifth lower insulation layers 120, 130, 140, and 150 may be stacked on the first capacitor CAP1. One or more second contacts CT2 may be provided to penetrate the second lower insulation layer 120 to come into electrical connection with the second electrode LEL2. The third to fifth lower insulation layers 130, 140, and 150 may be provided therein with wiring lines IL and vias VI. The vias VI may vertically connect the wiring lines IL. For example, the wiring lines IL of the first sub-chip CH1 may be electrically connected through the second contact CT2 to the first capacitor CAP1. Although FIG. 5 illustrates embodiments with the second to fifth lower insulation layers 120, 130, 140, and 150, some embodiments may include more or fewer insulation layers.

The device isolation layer ST may be on the second region RG2 of the first substrate 100 of the first sub-chip CH1. A bottom electrode BLP may be on the device isolation layer ST. The bottom electrode BLP may be electrically insulated from the first substrate 100 across the device isolation layer ST. When viewed in a plan view, the bottom electrode BLP may have a plate shape.

The second capacitor CAP2 may be on the bottom electrode BLP. The second capacitor CAP2 may include first electrodes LEL1, a second electrode LEL2, and a dielectric layer DIL between the second electrode LEL2 and the first electrodes LEL1.

The second capacitor CAP2 may be formed by the same process used to form the first capacitor CAP1 of the first region RG1. For example, the second capacitor CAP2 may be formed simultaneously with the first capacitor CAP1. As a result, the first electrodes LEL1 of the second capacitor CAP2 may have substantially the same shape and arrangement as those of the first electrodes LEL1 of the first capacitor CAP1.

For example, the first electrodes LEL1 of the first capacitor CAP1 may have a first pitch P1 in the third direction D3. The first electrodes LEL1 of the second capacitor CAP2 may have a second pitch P2 in the third direction D3. The first pitch P1 and the second pitch P2 may be substantially the same as each other. As used herein, the term "pitch" may refer to a distance between centers of neighboring patterns.

For example, the first electrodes LEL1 of the first capacitor CAP1 may have bottom surfaces BS at a first level LV1. The first electrodes LEL1 of the first capacitor CAP1 may have top surfaces TS at a second level LV2. The first electrodes LEL1 of the second capacitor CAP2 may have bottom surfaces BS at a third level LV3. The first electrodes LEL1 of the second capacitor CAP2 may have top surfaces TS at a fourth level LV4. The first and third levels LV1 and LV3 may be substantially the same as each other. The second and fourth levels LV2 and LV4 may be substantially the same as each other.

The second to fifth lower insulation layers 120, 130, 140, and 150 may be stacked on the second capacitor CAP2. The second to fifth lower insulation layers 120, 130, 140, and 150 may be provided therein with a second contact CT2, wiring lines IL, and vias VI.

The second sub-chip CH2 may include a second substrate 200, photoelectric conversion devices PCD, floating diffusion areas FDA, and readout circuit devices RCX, all of which components PCD, FDA, and RCX may be on the second substrate 200. The second substrate 200 may be a p-type impurity doped semiconductor substrate.

The readout circuit devices RCX may be on a first surface 200a of the second substrate 200. The readout circuit devices RCX may include a plurality of transistors (e.g., the transfer transistor TX, the reset transistor RX, the drive transistor DX, and the select transistor SX discussed above with reference to FIG. 2) that transfer and amplify electrical signals (e.g., photo-charges) corresponding to incident light. A may be provided thereon with A plurality of color filters CF and micro-lenses ML may be on second surface 200b of the second substrate 200 and may provide the incident light to the photoelectric conversion devices PCD. The second surface 200b may be opposite to the first surface 200a.

Ones of the photoelectric conversion devices PCD may include a respective photodiode. The photoelectric conversion devices PCD may be in the second substrate 200. The photoelectric conversion devices PCD may generate photo-charges corresponding to incident light. For example, ones of the photoelectric conversion devices PCD may generate an electron-hole pair corresponding to incident light. The photoelectric conversion devices PCD may be doped with impurities to have a different conductivity (e.g., n-type conductivity) from that of the second substrate 200.

The color filters CF may be on corresponding photoelectric conversion devices PCD. The color filters CF may be arranged in a matrix shape to constitute a color filter array.

In some embodiments, the color filter array may include a Bayer pattern consisting of red filters, green filters, and blue filters. Each of the color filters CF may be one of the red, green, and blue filters.

In other embodiments, the color filter array may include a Bayer pattern consisting of yellow filters, magenta filters, and cyan filters. Each of the color filters CF may be one of the yellow, magenta, and cyan filters.

The micro-lenses ML may be on corresponding color filters CF. The micro-lens ML may control a path of light incident thereon in such a way that the incident light is collected to the photoelectric conversion device PCD underlying the micro-lens ML. The micro-lenses ML may be arranged in a matrix shape to constitute a micro-lens array.

An anti-reflection layer 205 may be provided between the second surface 200b of the second substrate 200 and the color filters CF. The anti-reflection layer 205 may prevent incident light from being reflected on the second surface 200b of the second substrate 200. For example, the anti-reflection layer 205 may have a multi-layered structure where materials having different refractive indices are alternately stacked. The anti-reflection layer 205 may improve its transmittance with increasing the number of stacked materials having different refractive indices.

First to fourth upper insulation layers 210, 220, 230, and 240 may be stacked on the first surface 200a of the second substrate 200. The first to fourth upper insulation layers 210, 220, 230, and 240 may be provided therein with wiring lines IL and vias VI. The vias VI may vertically connect the wiring lines IL. For example, the wiring lines IL of the second sub-chip CH2 may be electrically connected to the readout circuit devices RCX.

The photoelectric conversion devices PCD of the second sub-chip CH2 may generate photo-charges in response to light incident on the second surface 200b of the second substrate 200. For example, the image sensor chip 20 according to some embodiments of the inventive concepts may be a backside illuminated image sensor (BIS).

An interconnector 310 may be included in the insert layer 300 between the first and second sub-chips CH1 and CH2. The interconnector 310 may electrically connect the wiring lines IL of the first sub-chip CH1 to the wiring lines IL of the second sub-chip CH2. The interconnector 310 may include metal such as copper or tungsten.

For example, the interconnector 310 may include a first conductive pattern 310a electrically connected to at least one wiring line IL of the first sub-chip CH1 and a second conductive pattern 310b electrically connected to at least one wiring line IL of the second sub-chip CH2. The first and second conductive patterns 310a and 310b may be in contact with each other and thereby electrically connected to each other. In some embodiments, the interconnector 310 may include more or fewer layers of conductive patterns.

The insert layer 300 may further include a first insulation layer 350a and a second insulation layer 350b. The first and second conductive patterns 310a and 310b may be provided respectively in the first and second insulation layers 350a and 350b. For example, the first and second insulation layers 350a and 350b may include a silicon oxide layer. In some embodiments, the insert layer 300 may include more or fewer insulation layers.

The insert layer 300 may further include a first metal diffusion break layer 360a, a second metal diffusion break layer 360b, and a third metal diffusion break layer 360c. The first metal diffusion break layer 360a may be interposed between the first sub-chip CH1 and the first insulation layer 350a, the second metal diffusion break layer 360b may be interposed between the first insulation layer 350a and the second insulation layer 350b, and the third metal diffusion break layer 360c may be interposed between the second insulation layer 350b and the second sub-chip CH2. The first to third metal diffusion break layers 360a, 360b, and 360c may include SiN, SiCN, SiOCN, SiON, or SiC. The first to third metal diffusion break layers 360a, 360b, and 360c may suppress metal constituents from being diffused from the interconnector 310. In some embodiments, the insert layer 300 may include more or fewer metal diffusion break layers.

Capacitance may be in proportion to the surface area of a capacitor electrode. In some embodiments, the first and second capacitors CAP1 and CAP2 may include the first electrode LEL1 that elongates vertically and has a cylindrical or cup shape. The first electrode LEL1 may also have a relatively high aspect ratio (i.e., the ratio of height to diameter), therefore the first electrode LEL1 may have a relatively large surface area. As a result, ones of the first and second capacitors CAP1 and CAP2 may have a relatively large value of capacitance relative to a surface area of ones of the first and second regions RG1 and RG2 on which the first and second capacitors CAP1 and CAP2 are respectively disposed.

The second capacitor CAP2 of the second region RG2 may be simultaneously formed by a fabrication process used to form the first capacitor CAP1 of the first region RG1. The image sensor chip 20 may thus be easily and economically fabricated because no additional process is required to form the second capacitor CAP2. Although the second region RG2 has a relatively small area, the second capacitor CAP2 of the second region RG2 may be used as various capacitors required for the signal processor CC of the image sensor. Accordingly, the image sensor chip 20 may increase in integration.

FIGS. 6 to 12 illustrate cross-sectional views taken along lines A-A' and B-B' of FIG. 4, illustrating intermediate operations of methods of fabricating image sensor chips according to some embodiments of the inventive concepts. A detailed description of technical features repetitive to those of the image sensor chips discussed above with reference to FIGS. 3 to 5 may be omitted for brevity, and a difference thereof may be explained in detail.

Figure 6:
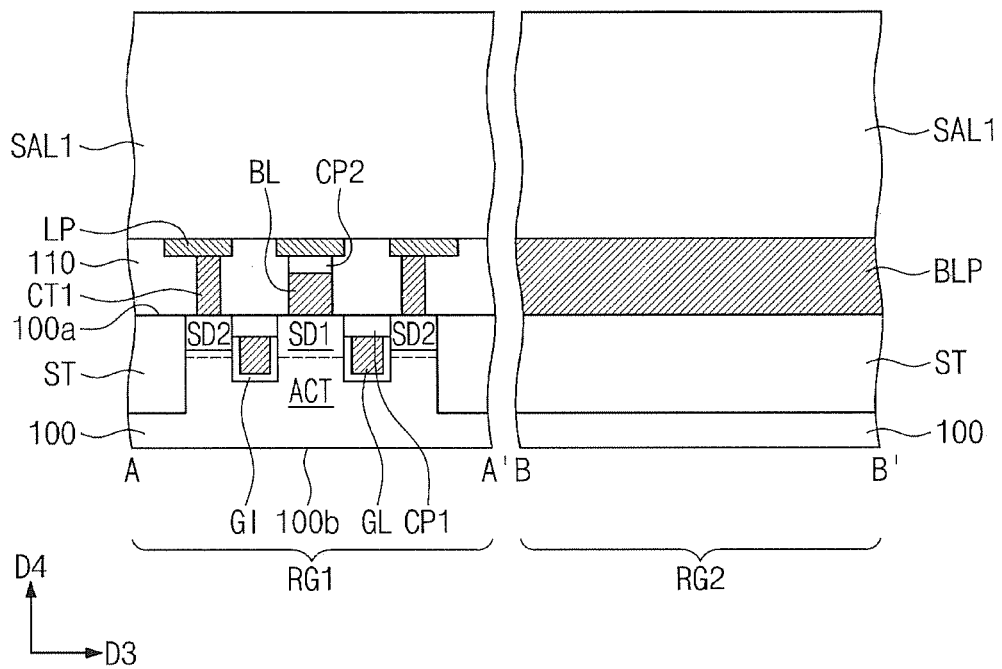
FIGS. 6 to 12 are cross-sectional views taken along lines A-A' and B-B' of FIG. 4, illustrating intermediate operations of methods of fabricating image sensor chips according to some embodiments of the inventive concepts.

Referring to FIGS. 4 and 6, a first substrate 100 may be provided to include a first region RG1 and a second region RG2. A device isolation layer ST may be faulted in the first substrate 100. A shallow trench Isolation (STI) process may be used to form the device isolation layer ST. The device isolation layer ST of the first region RG1 may define active regions ACT of the first substrate 100.

Gate lines GL may be formed in the first substrate 100, running across the active regions ACT. A gate dielectric pattern GI may be formed between the active region ACT and ones of the gate lines GL. The formation of the gate lines GL and the gate dielectric patterns GI may include etching the active regions ACT and the device isolation layer ST to form linear shape trenches extending in a second direction D2, forming a gate dielectric layer to conformally partially fill ones of the trenches, and forming a conductive layer to completely fill remainders of the ones of the trenches. First capping patterns CP1 may be formed on the gate lines GL.

The active regions ACT may experience an ion implantation process to form a first impurity region SD1 and a pair of second impurity regions SD2 in ones of the active regions ACT. A first lower insulation layer 110 may be formed on the first substrate 100, covering the active regions ACT and the device isolation layer ST.

Bit lines BL, first contacts CT1, and landing pads LP may be formed in the first lower insulation layer 110 of the first region RG1. Each of the bit lines BL may be formed to be electrically connected to a corresponding one of the first impurity regions SD1. Each of the first contacts CT1 may be formed to be electrically connected to a corresponding one of the second impurity regions SD2. Each of the landing pads LP may be formed on a corresponding one of the first contacts CT1.

A bottom electrode BLP may be formed in the first lower insulation layer 110 of the second region RG2. The bottom electrode BLP may be electrically insulated from the first substrate 100 across the device isolation layer ST.

A first sacrificial layer SAL1 may be formed on the first lower insulation layer 110. The first sacrificial layer SAL1 of the first region RG1 may cover the landing pads LP. The first sacrificial layer SAL1 of the second region RG2 may cover the bottom electrode BLP. For example, the first sacrificial layer SAL1 may include a silicon oxide layer.

Figure 7:
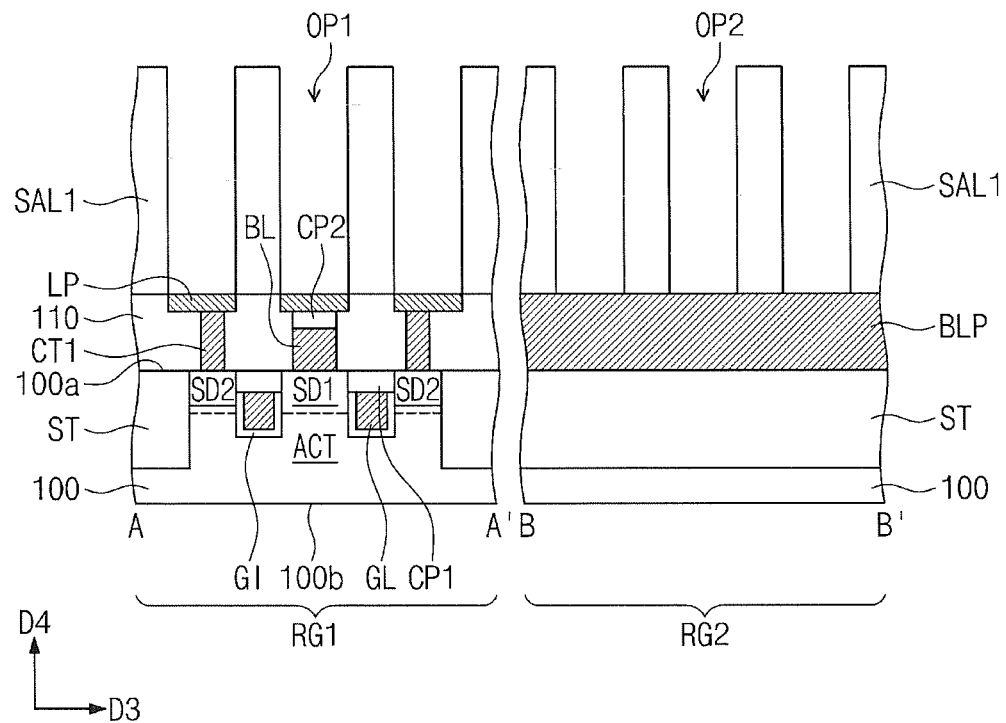

Referring to FIGS. 4 and 7, the first sacrificial layer SAL1 may be patterned to form first openings OP1. Each of the first openings OP1 may be formed to have a circular shape when viewed in a plan view. The first openings OP1 may be formed to have planar shape and arrangement the same as those of the first electrodes LEL1 discussed above with reference to FIG. 4.

The first openings OP1 of the first region RG1 may expose the landing pads LP. The first openings OP1 of the second region RG2 may partially expose the bottom electrode BLP.

Figure 8:
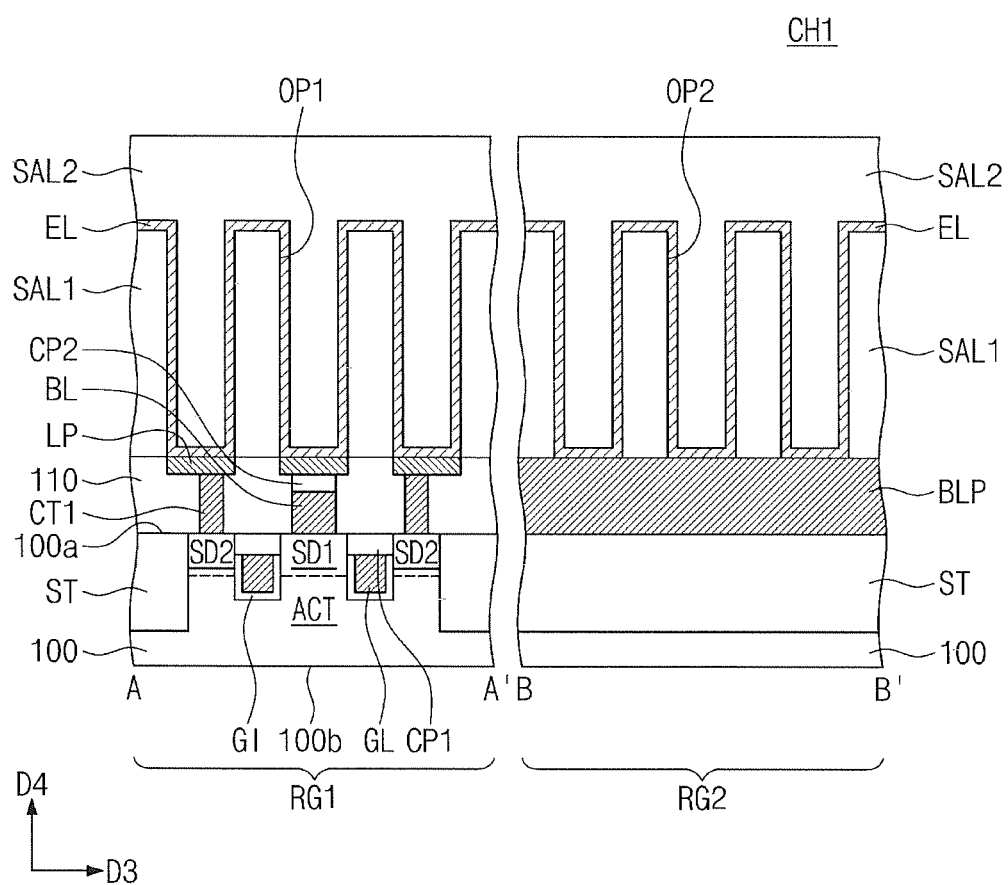

Referring to FIGS. 4 and 8, an electrode layer EL may be conformally formed on the first sacrificial layer SAL1. The electrode layer EL may partially fill the first openings OP1. The electrode layer EL may directly cover the landing pads LP exposed to the first openings OP1, and may cover portions of the bottom electrode BLP that are exposed to the first openings OP1. The electrode layer EL may be formed using one or more of doped semiconductor, conductive metal nitride, metal, and metal-semiconductor compound.

A second sacrificial layer SAL2 may be formed on the electrode layer EL. The second sacrificial layer SAL2 may be formed to completely fill the first openings OP1. The second sacrificial layer SAL2 may be formed using the same material as that of the first sacrificial layer SAL1.

Figure 9:
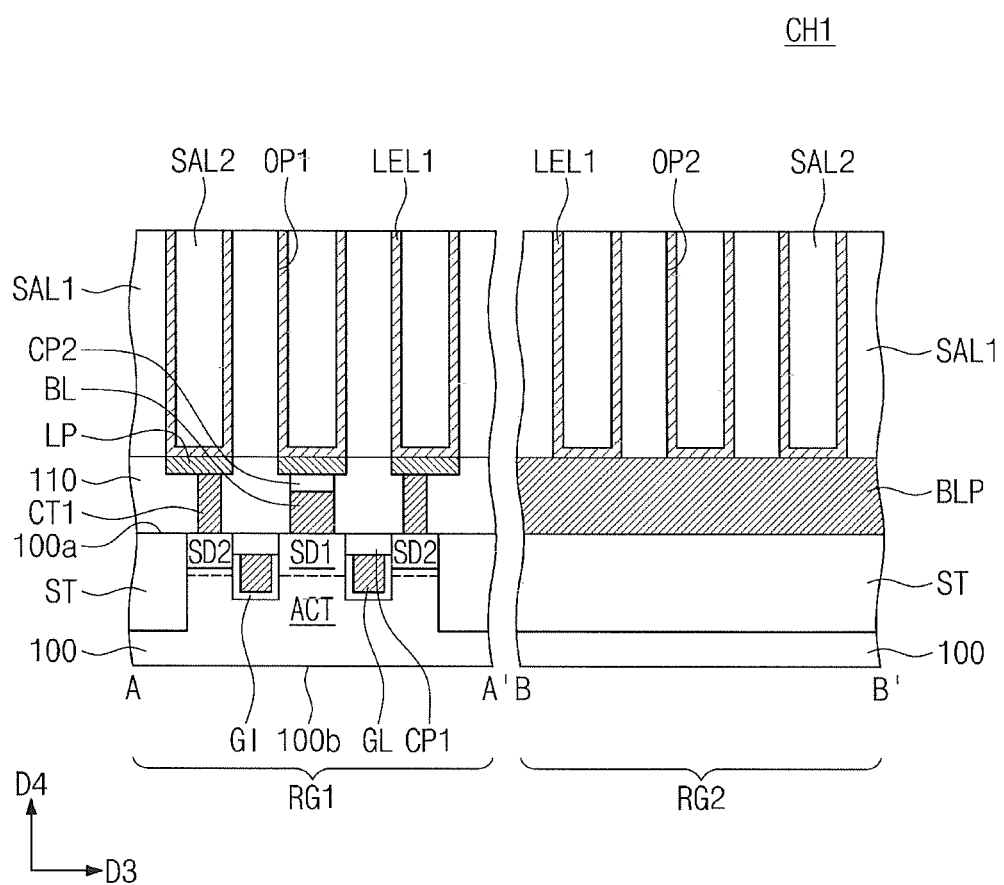

Referring to FIGS. 4 and 9, a planarization process may be performed on the electrode layer EL and the second sacrificial layer SAL2 until a top surface of the first sacrificial layer SAL1 is exposed. The electrode layer EL may be planarized to form first electrodes LEL1 in the first openings OP1. Each of the first electrodes LEL1 may be formed to have a cylindrical or cup shape.

Figure 10:
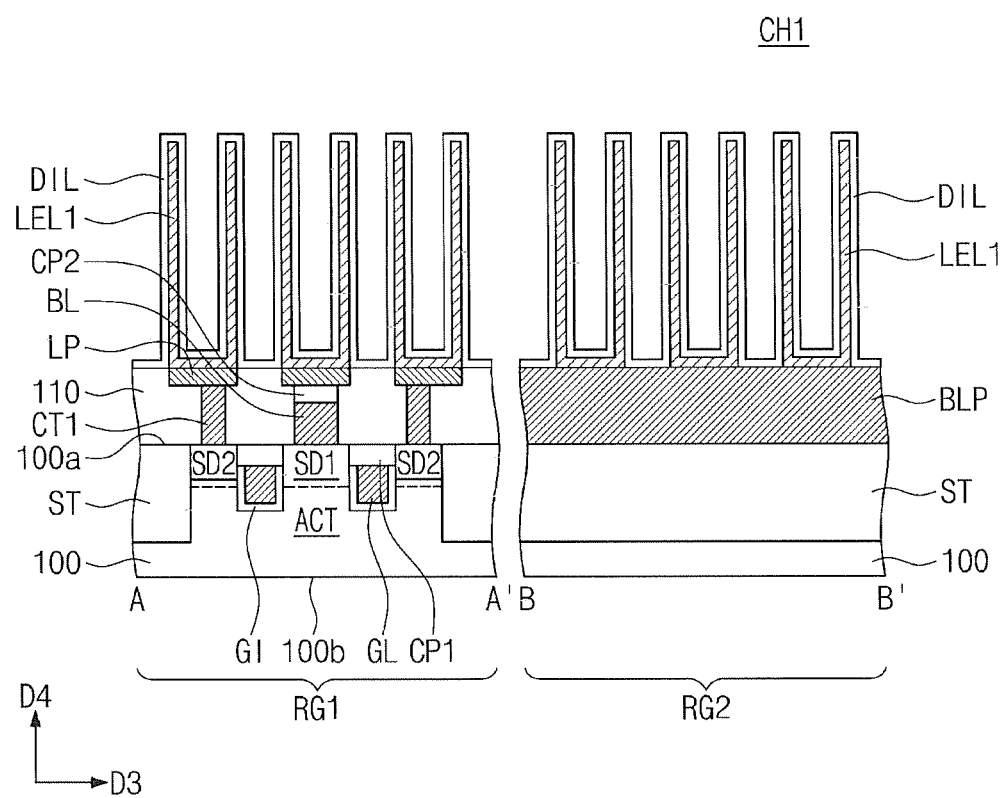

Referring to FIGS. 4 and 10, the first and second sacrificial layers SAL1 and SAL2 may be selectively removed. The first electrodes LEL1 may thus remain on the first lower insulation layer 110. A dielectric layer DIL may be conformally formed on the first electrodes LEL1. The dielectric layer DIL may be formed using a high-k dielectric material.

Figure 11:
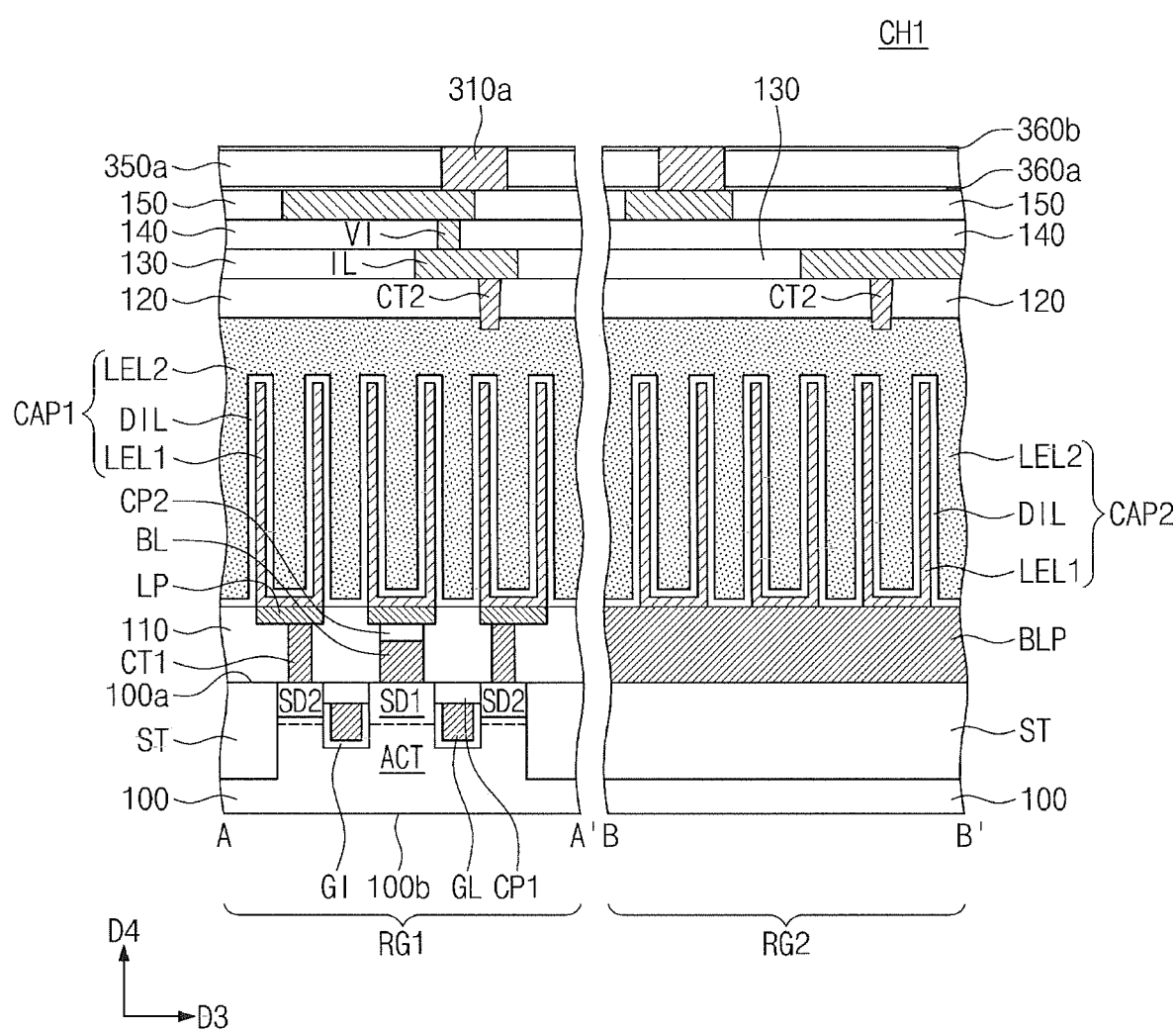

Referring to FIGS. 4 and 11, a second electrode LEL2 may be formed on the dielectric layer DIL. The second electrode LEL2 may be formed to have a portion filling a cylindrically shaped inside of the first electrode EL1. The second electrode LEL2 may be formed using one or more of doped semiconductor, conductive metal nitride, metal, and metal-semiconductor compound.

A first capacitor CAP1 may be constituted by the first electrodes LEL1, the dielectric layer DIL, and the second electrode LEL2 that are formed on the first region RG1. A second capacitor CAP2 may be constituted by the first electrodes LEL1, the dielectric layer DIL, and the second electrode LEL2 that are formed on the second region RG2.

Second to fifth lower insulation layers 120, 130, 140, and 150 may be formed on the first and second capacitors CAP1 and CAP2. Second contacts CT2 may be formed to penetrate the second lower insulation layer 120 and electrically connected to the second electrodes LEL2. Wiring lines IL and vias VI may be formed in the third to fifth lower insulation layers 130, 140, and 150. A first insulation layer 350a may be formed on the fifth lower insulation layer 150. A first metal diffusion break layer 360a may be formed between the first insulation layer 350a and the fifth lower insulation layer 150, and a second metal diffusion break layer 360b may be formed on the first insulation layer 350a. First conductive patterns 310a may be formed in the first insulation layer 350a.

A first sub-chip CH1 may be prepared by the fabrication processes discussed above with reference to FIGS. 4 and 6 to 11.

Figure 12:
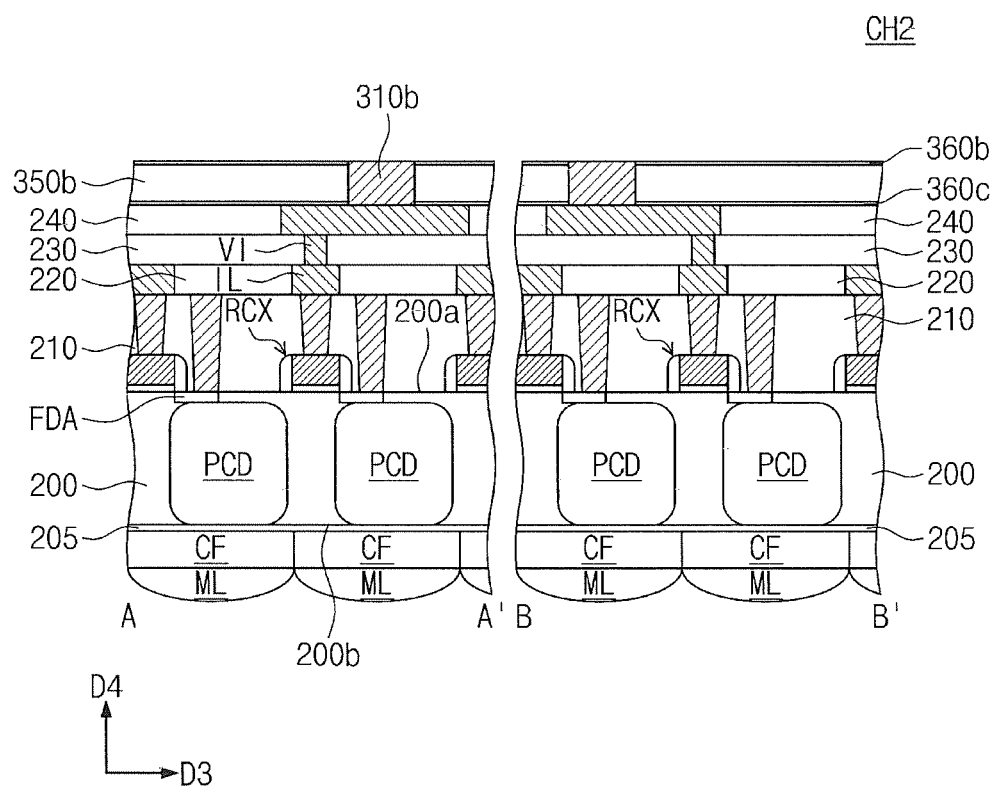

Referring to FIG. 12, a second sub-chip CH2 may be prepared to lie on the first sub-chip CH1.

For example, photoelectric conversion devices PCD may be formed in a second substrate 200. Readout circuit devices RCX may be formed on a first surface 200a of the second substrate 200. First to fourth upper insulation layers 210, 220, 230, and 240 may be formed on the readout circuit devices RCX. Wiring lines IL and vias VI may be formed in the first to fourth upper insulation layers 210, 220, 230, and 240.

A second insulation layer 350b may be formed on the fourth upper insulation layer 240. A third metal diffusion break layer 360c may be formed between the second insulation layer 350b and the fourth upper insulation layer 240, and a second metal diffusion break layer 360b may be formed on the second insulation layer 350b. Second conductive patterns 310b may be formed in the second insulation layer 350b.

An anti-reflection layer 205, color filters CF, and microlenses ML may be formed on a second surface 200b of the second substrate 200.

Referring back to FIGS. 4 and 5, the prepared first and second sub-chips CH1 and CH2 may be stacked to face each other, with result that an image sensor chip 20 may be formed. One of the first conductive patterns 310a and a corresponding one of the second conductive patterns 310b may be physically and electrically connected to form an interconnector 310. The interconnector 310 may vertically connect the first sub-chip CH1 and the second sub-chip CH2 to each other.

Figure 13:
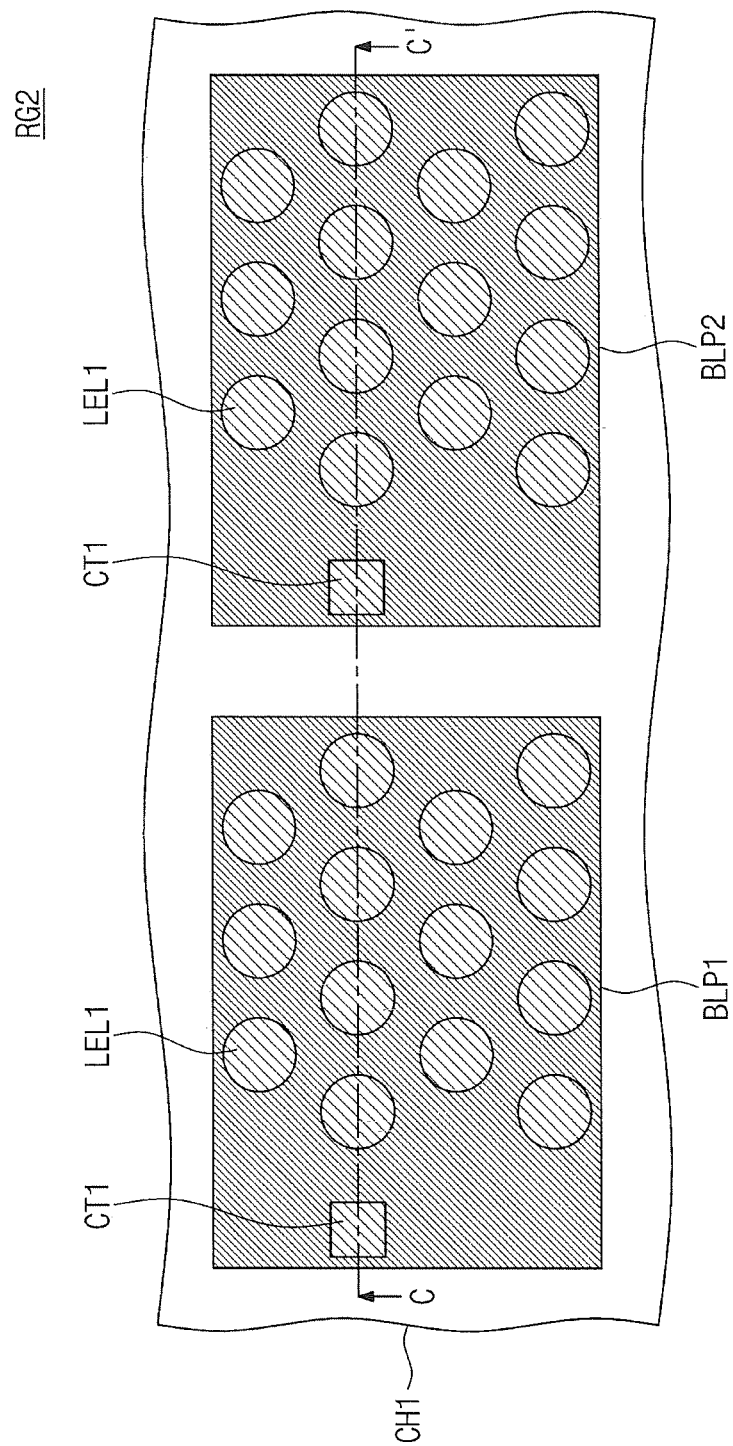
FIG. 13 is a plan view illustrating a second region of a first sub-chip according to some embodiments of the inventive concepts.
Figure 14:
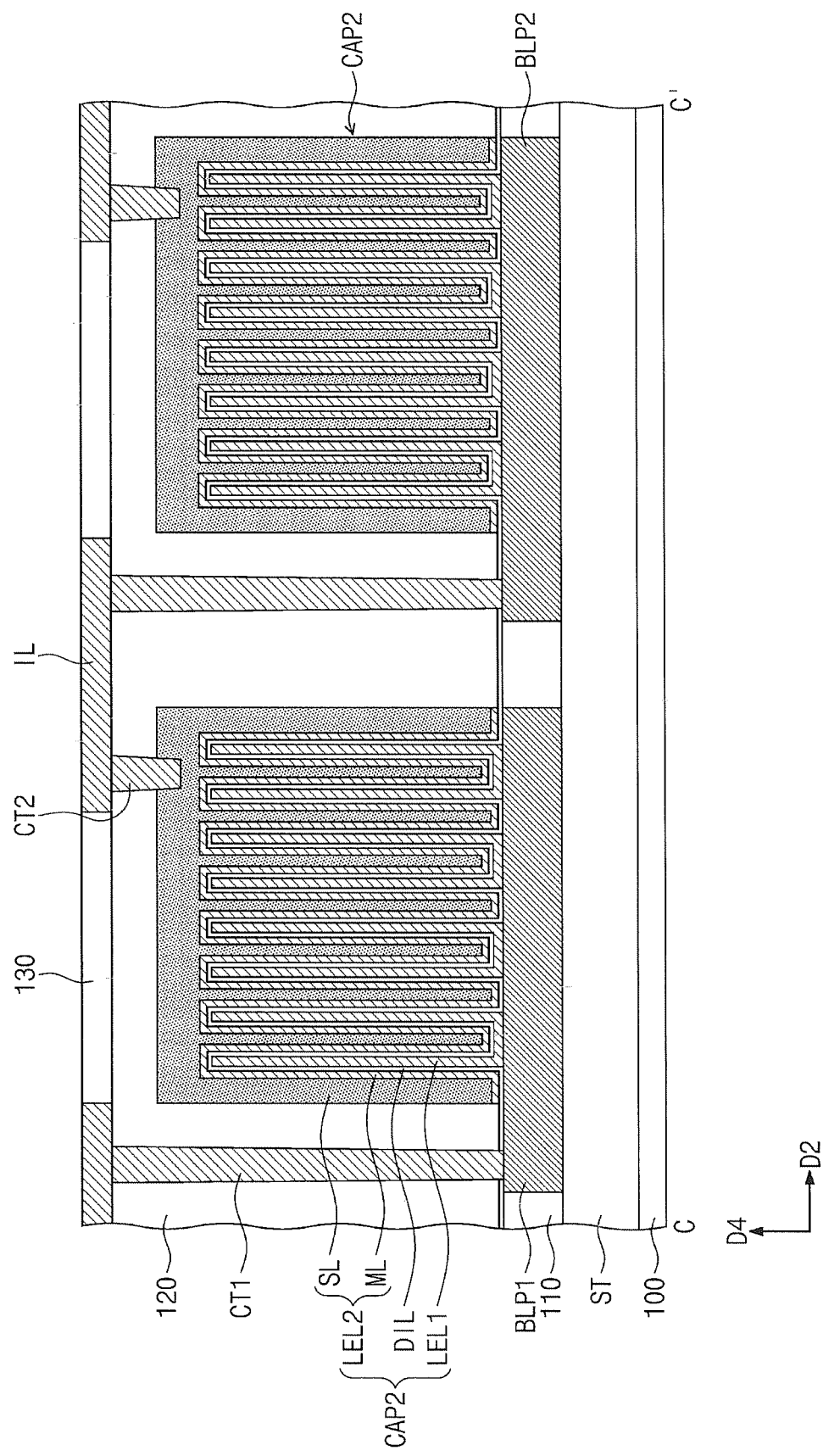
FIG. 14 is a cross-sectional view taken along line C-C' of FIG. 13 according to some embodiments of the inventive concepts.

FIG. 13 is a plan view illustrating a second region of a first sub-chip according to some embodiments of the inventive concepts. FIG. 14 is a cross-sectional view taken along line C-C' of FIG. 13 according to some embodiments of the inventive concepts. A detailed description of technical features repetitive to those discussed above with reference to FIGS. 3 to 5 may be omitted for brevity, and a difference thereof may be explained in detail.

Referring to FIGS. 13 and 14, the first lower insulation layer 110 may be provided on the device isolation layer ST that is provided on the second region RG2 of the first substrate 100. The first lower insulation layer 110 may be provided therein with a first bottom electrode BLP1 and a second bottom electrode BLP2. The second bottom electrode BLP2 may be spaced apart in the second direction D2 from the first bottom electrode BLP1. The first and second bottom electrodes BLP1 and BLP2 may have substantially the same shape as each other when viewed in a plan view.

The second capacitor CAP2 may be provided on each of the first and second bottom electrodes BLP1 and BLP2. The second capacitor CAP2 on the second bottom electrode BLP2 may be spaced apart in the second direction D2 from the second capacitor CAP2 on the first bottom electrode BLP1. Each of the second capacitors CAP2 may include the first electrodes LEL1, the second electrode LEL2, and the dielectric layer DIL between the second electrode LEL2 and the first electrodes LEL1.

Each of the first electrodes LEL1 may have a cylindrical or cup shape. For example, the first electrodes LEL1 may include metal nitride layer such as a titanium nitride (TiN) layer, a titanium silicon nitride (TiSiN) layer, a titanium aluminum nitride (TiAlN) layer, a tantalum nitride (TaN) layer, tantalum silicon nitride (TaSiN) layer, tantalum aluminum nitride (TaAlN) layer, or a tungsten nitride (WN) layer.

Each of the second bottom electrodes LEL2 may include a metal layer MTL directly covering the dielectric layer DIL and a semiconductor layer SL on the metal layer MTL. The metal layer MTL may have a uniform thickness on a surface of the dielectric layer DIL. For example, the metal layer MTL may include metal nitride layer such as a titanium nitride (TiN) layer, a titanium silicon nitride (TiSiN) layer, a titanium aluminum nitride (TiAlN) layer, a tantalum nitride (TaN) layer, tantalum silicon nitride (TaSiN) layer, tantalum aluminum nitride (TaAlN) layer, or a tungsten nitride (WN) layer. The semiconductor layer SL may include a doped semiconductor material. For example, the semiconductor layer SL may include silicon, germanium, or silicon-geniianium.

The second lower insulation layer 120 may be provided to cover the second capacitors CAP2. The first contacts CT1 may be provided to penetrate the second lower insulation layer 120 and electrically connect to the first and second bottom electrodes BLP1 and BLP2. The second contacts CT2 may be provided to penetrate an upper portion of the second lower insulation layer 120 and electrically connect to the semiconductor layers SL of the second electrodes LEL2.

A third lower insulation layer 130 may be provided on the second lower insulation layer 120. The third lower insulation layer 130 may be provided therein with a wiring line IL that connects the first and second contacts CT1 and CT2 adjacent to each other.

The second capacitor CAP2 on the first bottom electrode BLP1 may be connected in series to the second capacitor CAP2 on the second bottom electrode BLP2. For example, the second electrode LEL2 of the second capacitor CAP2 on the first bottom electrode BLP1 may be electrically connected to the second bottom electrode BLP2 through the second contact CT2, the wiring line IL, and the first contact CT1. One capacitor may be constituted by the second capacitors CAP2 that are formed spaced apart from each other and are connected in series to each other.

Figure 15:
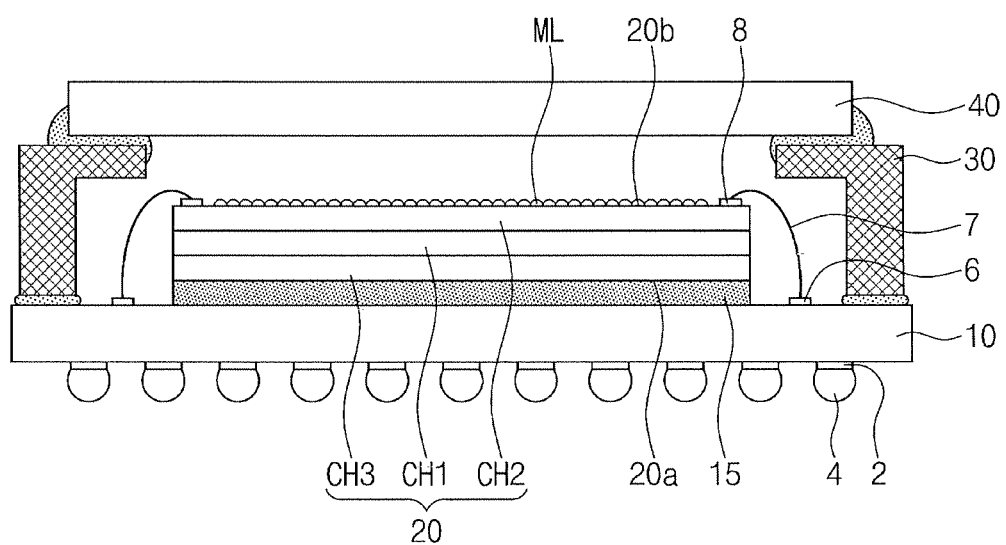
FIG. 15 is a cross-sectional view illustrating a semiconductor package mounted with an image sensor chip according to some embodiments of the inventive concepts.

FIG. 15 is a cross-sectional view illustrating a semiconductor package in which an image sensor chip is mounted, according to some embodiments of the inventive concepts. A detailed description of technical features repetitive to those discussed above with reference to FIGS. 3 to 5 may be omitted for brevity, and a difference thereof may be explained in detail.

Referring to FIG. 15, the image sensor chip 20 may include a first sub-chip CH1, a second sub-chip CH2, and a third sub-chip CH3 that are vertically stacked. The third sub-chip CH3 may be interposed between the first sub-chip CH1 and the package substrate 10.

Each of the first and third sub-chips CH1 and CH3 may include one or more of a logic zone, a memory cell zone, and a signal processing zone. For example, the first sub-chip CH1 may include a memory cell zone and a signal processing zone, and the third sub-chip CH3 may include a logic zone. For another example, the first sub-chip CH1 may include a memory cell zone and a logic zone, and the third sub-chip CH3 may include a signal processing zone.

An image sensor chip according to some embodiments of the inventive concepts may include a capacitor whose capacitance is relatively large relative to a unit area. The capacitor may be economically fabricated and used as a capacitor of a signal processor of an image sensor.

Although the present invention has been described in connection with the embodiments of the inventive concepts illustrated in the accompanying drawings, it will be understood to those skilled in the art that various changes and modifications may be made without departing from the technical spirit and essential feature of the inventive concepts. It will be apparent to those skilled in the art that various substitution, modifications, and changes may be thereto without departing from the scope and spirit of the inventive concepts.

What is claimed is:

1. An image sensor chip, comprising:
a first sub-chip;
a second sub-chip on the first sub-chip; and
an interconnector between the first and second sub-chips,
wherein the first sub-chip comprises:
a first substrate;
a bottom electrode on a first region of the first substrate; and
a first capacitor on the bottom electrode,
wherein the first capacitor comprises:
a plurality of first electrodes vertically extending from a top surface of the bottom electrode;
a second electrode on the first electrodes; and
a first dielectric layer between the second electrode and the first electrodes,
wherein the second sub-chip comprises a pixel array that is configured to convert incident light into an electrical signal,
wherein the pixel array is electrically connected through the interconnector to the first capacitor, and
wherein each of first electrodes comprises:
a floor segment on the top surface of the bottom electrode; and
a sidewall segment vertically extending from the floor segment.

2. The image sensor chip of claim 1,
wherein the first sub-chip further comprises:
a memory transistor on a second region of the first substrate; and
a second capacitor electrically connected to the memory transistor through landing pads, and
wherein the second capacitor comprises:
a third electrode vertically extending from top surfaces of the landing pads;
a fourth electrode on the third electrode; and
a second dielectric layer between the fourth electrode and the third electrode.

3. The image sensor chip of claim 2,
wherein top surfaces of the first electrodes are at a first level, and
wherein top surfaces of the third electrode is at a second level that is substantially the same as the first level.

4. The image sensor chip of claim 2,
wherein the second capacitor comprises a plurality of second capacitors comprising the fourth electrode on a plurality of third electrodes,
wherein the first electrodes are arranged at a first pitch along a first direction on the first region,
wherein the third electrodes are arranged at a second pitch along the first direction on the second region, and
wherein the first pitch is substantially the same as the second pitch.

5. The image sensor chip of claim 2, wherein a diameter of ones of the first electrodes is substantially the same as a diameter of the third electrode.

6. The image sensor chip of claim 1, wherein the pixel array comprises a plurality of unit pixels arranged in a matrix shape,
wherein each of the unit pixels comprises:
a photodiode in a second substrate;
a plurality of readout circuit devices on a first surface of the second substrate; and
a color filter and a micro-lens on a second surface of the second substrate.

7. The image sensor chip of claim 1, wherein each of the first and second sub-chips comprises a plurality of wiring lines and a plurality of vias,
wherein the wiring lines of the first sub-chip comprise a first wiring line adjacent to the interconnector,
wherein the wiring lines of the second sub-chip comprise a second wiring line adjacent to the interconnector, and
wherein the interconnector comprises a conductive pattern that electrically connects the first wiring line to the second wiring line.

8. The image sensor chip of claim 1,
wherein the bottom electrode comprises:
a first bottom electrode; and
a second bottom electrode horizontally spaced apart from the first bottom electrode, and
wherein the first sub-chip further comprises:
a first contact connected to the second electrode of the first capacitor on the first bottom electrode;
a second contact connected to the second bottom electrode; and
a wiring line connecting the first and second contacts.

9. The image sensor chip of claim 1, wherein the first capacitor is used as a capacitor of a correlated double sampler (CDS) circuit.

10. An image sensor chip, comprising:
a first sub-chip;
a second sub-chip on the first sub-chip; and
an interconnector between the first and second sub-chips,
wherein the first sub-chip comprises:
a first substrate including a first region and a second region; and
first and second capacitors provided respectively on the first and second regions,
wherein the second sub-chip comprises a pixel array that is configured to convert incident light into an electrical signal,
wherein the first capacitor is electrically connected to a memory transistor on the first region,
wherein the second capacitor is electrically connected through the interconnector to the pixel array,
wherein each of the first and second capacitors comprises:
a plurality of first electrodes extending in a direction perpendicular to a top surface of the first substrate;
a second electrode on the first electrodes; and
a dielectric layer between the second electrode and the first electrodes,
wherein the memory transistor comprises:
an active region on the first region and including a first impurity region and a second impurity region;
a gate line between the first and second impurity regions and embedded in the active region, and a bit line electrically connected to the first impurity region, and wherein the first capacitor is electrically connected to the second impurity region.

11. The image sensor chip of claim 10, wherein the first electrodes of the first capacitor have top surfaces at a first level, and wherein the first electrodes of the second capacitor have top surfaces at a second level that is substantially the same as the first level.

12. The image sensor chip of claim 10, wherein the first electrodes of the first capacitor are arranged at a first pitch along a first direction on the first region, and the first electrodes of the second capacitor are arranged at a second pitch along the first direction on the second region, the second pitch being substantially the same as the first pitch.

13. The image sensor chip of claim 10, wherein each of the first and second sub-chips comprises a plurality of wiring lines and a plurality of vias, wherein the wiring lines of the first sub-chip comprise a first wiring line adjacent to the interconnector, wherein the wiring lines of the second sub-chip comprise a second wiring line adjacent to the interconnector, and wherein the interconnector comprises a conductive pattern that electrically connects the first wiring line to the second wiring line.

14. An image sensor chip, comprising:

a first sub-chip comprising a memory cell zone and a signal processing zone;

a second sub-chip on the first sub-chip, the second sub-chip comprising a pixel array configured to convert incident light into an electrical signal; and a third sub-chip on a bottom surface of the first sub-chip opposite the second sub-chip, the third sub-chip comprises a logic zone, wherein the first sub-chip comprises:

a first capacitor on the memory cell zone; and a second capacitor on the signal processing zone, wherein each of the first and second capacitors comprises a plurality of vertically extending first electrodes, wherein top surfaces of the first electrodes of the first capacitor are substantially coplanar with top surfaces of the first electrodes of the second capacitor.

15. The image sensor chip of claim 14, wherein the first electrodes of the first capacitor are arranged at a first pitch along a first direction, and wherein the first electrodes of the second capacitor are arranged at a second pitch along the first direction that is substantially the same as the first pitch.

16. The image sensor chip of claim 14, wherein a diameter of ones of the first electrodes of the first capacitor is substantially the same as a diameter of ones of the first electrodes of the second capacitor.

17. The image sensor chip of claim 14, further comprising an interconnector between the first and second sub-chips, wherein the pixel array of the second sub-chip is electrically connected through the interconnector to the signal processing zone of the first sub-chip.

* * * * *